United States Patent
Choi et al.

(10) Patent No.: US 11,424,388 B2
(45) Date of Patent: Aug. 23, 2022

(54) LIGHT-EMITTING DEVICE AND DISPLAY DEVICE INCLUDING THE SAME

(71) Applicant: SAMSUNG ELECTRONICS CO., LTD., Suwon-si (KR)

(72) Inventors: Junhee Choi, Seongnam-si (KR); Kiho Kong, Suwon-si (KR); Jinjoo Park, Suwon-si (KR); Joohun Han, Hwaseong-si (KR); Kyungwook Hwang, Hwaseong-si (KR); Sungjin Kang, Seoul (KR); Junghun Park, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/562,791

(22) Filed: Sep. 6, 2019

(65) Prior Publication Data
US 2020/0083405 A1 Mar. 12, 2020

(30) Foreign Application Priority Data
Sep. 7, 2018 (KR) .......................... 10-2018-0107388

(51) Int. Cl.
*H01L 33/46* (2010.01)
*H01L 25/16* (2006.01)

(52) U.S. Cl.
CPC ............ *H01L 33/46* (2013.01); *H01L 25/167* (2013.01)

(58) Field of Classification Search
CPC .................................. H01L 33/10; H01L 33/46
See application file for complete search history.

(56) References Cited

U.S. PATENT DOCUMENTS

2003/0128729 A1* 7/2003 Matsumura ............... H01S 5/22
372/46.01
2006/0245460 A1 11/2006 Luo et al.
(Continued)

FOREIGN PATENT DOCUMENTS

| JP | 6088132 B2 | 3/2017 |
| KR | 10-1476207 B1 | 12/2014 |
| KR | 10-2015-0092478 A | 8/2015 |

OTHER PUBLICATIONS

Ludovic Dupré et al., "Processing and characterization of high resolution GaN/InGaN LED arrays at 10 micron pitch for micro display applications.", Proceedings of SPIE, vol. 10104, 1010422, doi: 10.1117/12.2252196, 2017, pp. 1-8, 17 pages total.
(Continued)

*Primary Examiner* — Moin M Rahman
*Assistant Examiner* — Mohammad A Rahman
(74) *Attorney, Agent, or Firm* — Sughrue Mion, PLLC

(57) ABSTRACT

Provided is a light-emitting device including a substrate, a light-emitting pattern provided on the substrate, a first reflection film provided between the light-emitting pattern and the substrate, a second reflection film provided on a side surface of the light-emitting pattern, and a passivation film provided between the light-emitting pattern and the second reflection film, wherein the second reflection film is electrically connected to the light-emitting pattern, and a portion of light generated from the light-emitting pattern is emitted through an upper surface of the light-emitting pattern after being reflected by at least one of the first reflection film and the second reflection film.

17 Claims, 11 Drawing Sheets

(56) References Cited

U.S. PATENT DOCUMENTS

| | | | | |
|---|---|---|---|---|
| 2007/0115226 A1* | 5/2007 | Jung | ................ | G09G 3/3233 |
| | | | | 345/76 |
| 2011/0193123 A1* | 8/2011 | Moon | ................ | H01L 33/382 |
| | | | | 257/E33.072 |
| 2011/0204402 A1* | 8/2011 | Jeong | ................ | H01L 33/385 |
| | | | | 257/E33.065 |
| 2013/0193409 A1* | 8/2013 | Gaska | ................ | H01L 33/46 |
| | | | | 257/13 |
| 2014/0306176 A1* | 10/2014 | Chiu | ................ | H01L 33/06 |
| | | | | 257/13 |
| 2015/0147835 A1* | 5/2015 | Choi | ................ | H01L 33/0093 |
| | | | | 438/29 |

OTHER PUBLICATIONS

Tommy Ive et al., "Crack-free and conductive Si-doped AlN/GaN distributed Bragg reflectors grown on 6H—SiC (0001)", Applied Physics Letters, vol. 85, No. 11, Sep. 13, 2004, pp. 1970-1972, 4 pages total.

A. Kakanakova-Georgieva et al., "n-Type conductivity bound by the growth temperature: the case of $Al_{0.72}Ga_{0.28}N$ highly doped by silicon", Journal of Materials Chemistry C, 4, DOI: 10.1039/c6tc02825j, 2016, pp. 8291-8296, 6 pages total.

* cited by examiner

LIGHT-EMITTING DEVICE AND DISPLAY DEVICE INCLUDING THE SAME

CROSS-REFERENCE TO RELATED APPLICATION

This application claims priority from Korean Patent Application No. 10-2018-0107388, filed on Sep. 7, 2018 in the Korean Intellectual Property Office, the disclosure of which is incorporated herein in its entirety by reference.

BACKGROUND

1. Field

Example embodiments of the present disclosure relate to light-emitting devices and display devices including the light-emitting devices, and more particularly, to light-emitting devices having increased light characteristics and display devices including the light-emitting devices.

2. Description of the Related Art

Liquid crystal displays (LCDs) and organic light emitting diode (OLED) displays are widely used as display devices. Recently, a technique for manufacturing a high resolution display device by using a micro-light emitting diode (micro-LED) are being developed. However, in order to manufacture a high resolution display device by using the micro-LED, a high efficiency small light emitting diode (LED) chip should be manufactured, and in order to arrange the small LED chips in an appropriate location, a high level of transfer technique is required.

SUMMARY

One or more example embodiments provide light-emitting devices having increased light characteristics.

One or more example embodiments also provide display devices having increased light characteristics.

Additional aspects will be set forth in part in the description which follows and, in part, will be apparent from the description, or may be learned by practice of example embodiments.

According to an aspect of an example embodiment, there is provided a light-emitting device including a substrate, a light-emitting pattern provided on the substrate, a first reflection film provided between the light-emitting pattern and the substrate, a second reflection film provided on a side surface of the light-emitting pattern, and a passivation film provided between the light-emitting pattern and the second reflection film, wherein the second reflection film is electrically connected to the light-emitting pattern, and a portion of light generated from the light-emitting pattern is emitted through an upper surface of the light-emitting pattern after being reflected by at least one of the first reflection film and the second reflection film.

The second reflection film may be provided along the passivation film and contacts the upper surface of the light-emitting pattern.

The second reflection film may overlap the first reflection film in a direction parallel to an upper surface of the substrate in a region adjacent to the first reflection film.

The light-emitting device may further include a transparent electrode provided on the upper surface of the light-emitting pattern, wherein the second reflection film is electrically connected to the light-emitting pattern through the transparent electrode.

The first reflection film may be provided along an upper surface of the substrate and protrudes in a direction parallel to the upper surface of the substrate from the side surface of the light-emitting pattern.

The first reflection film may include a distributed Bragg reflector (DBR) having conductivity.

The first reflection film may include a distributed Bragg reflector (DBR) having an insulating property, and the light-emitting device may further include a conductive via that passes through the first reflection film in a direction normal to an upper surface of the substrate.

The first reflection film may include a metal.

The light-emitting device may further include light extraction patterns provided on the upper surface of the light-emitting pattern.

The light-emitting device may further include a vertical lower electrode provided on a bottom surface of the substrate, the light-emitting pattern may include a lower semiconductor layer, an active layer, and an upper semiconductor layer that are sequentially stacked on the first reflection film, the substrate and the lower semiconductor layer may be respectively a first conductivity type, the upper semiconductor layer may be a second conductivity type that is different from the first conductivity type, the vertical lower electrode may be electrically connected to the lower semiconductor layer through the substrate and the first reflection film, and the passivation film may directly contact an upper surface of the upper semiconductor layer.

The light-emitting device may further include a seed semiconductor layer provided between the first reflection film and the substrate, wherein the seed semiconductor layer may include a lower region, and a protrusion region protruding from an upper surface of the lower region in a direction normal to an upper surface of the substrate.

The first reflection film may be provided between the light-emitting pattern and the protrusion region, and a side surface of the protrusion region, a side surface of the first reflection film, and the side surface of the light-emitting pattern may be coplanar.

The light-emitting device may further include a horizontal lower electrode provided on the upper surface of the lower region, wherein the light-emitting pattern may include a lower semiconductor layer, an active layer, and an upper semiconductor layer that are sequentially stacked on the first reflection film, wherein the lower semiconductor layer and the seed semiconductor layer may be respectively a first conductivity type, wherein the upper semiconductor layer may be a second conductivity type, wherein the horizontal lower electrode and the lower semiconductor layer may be electrically connected to each other through the seed semiconductor layer and the first reflection film, and wherein the passivation film may directly contact an upper surface of the upper semiconductor layer.

According to an aspect of another example embodiment, there is provided a display device including a substrate, a plurality of light-emitting patterns provided on the substrate, a plurality of first reflection films respectively provided between the plurality of light-emitting patterns and the substrate, a plurality of passivation films respectively provided between the plurality of light-emitting patterns, a plurality of second reflection films respectively provided along the plurality of passivation films, and a plurality of transistors respectively electrically connected to the plurality of light-emitting patterns, wherein a portion of beams generated from the plurality of light-emitting patterns, respectively, are reflected by at least one of the plurality of first reflection films and the plurality of second reflection film, and are emitted through the plurality of light-emitting patterns.

The display device may further include a lower capping film provided on the plurality of light-emitting patterns and the plurality of second reflection films, wherein mesa regions may be provided between the plurality of light-emitting patterns, and wherein the lower capping film may include an upper region, first protrusion capping regions protruding respectively from the upper region towards each of the plurality of light-emitting patterns, and second protrusion capping regions respectively protruding from the upper region into the mesa regions.

The display device may further include a seed semiconductor layer provided between the substrate and each of the plurality of first reflection films, wherein the seed semiconductor layer may include a lower region, and a plurality of protrusion regions protruding from an upper surface of the lower region in a direction normal to an upper surface of the substrate.

The plurality of passivation films may respectively extend from side surfaces of the plurality of light-emitting patterns directly adjacent to the plurality of passivation films to upper surfaces of the plurality of light-emitting patterns and contact the upper surfaces of the plurality of light-emitting patterns.

The display device may further include a lower capping film provided on the plurality of light-emitting patterns and the plurality of second reflection films, and a plurality of contacts respectively provided between the plurality of light-emitting patterns, wherein the lower capping film may include an upper region, and protrusion capping regions respectively protruding from the upper region towards each of the plurality of light-emitting patterns, and wherein the plurality of contacts may respectively be provided between the upper region and the plurality of second reflection films.

The display device may further include a plurality of light control patterns respectively provided on the plurality of light-emitting patterns, wherein the plurality of light control patterns respectively may control characteristics of light emitted from the plurality of light-emitting patterns.

The plurality of light-emitting patterns respectively may emit blue light, and wherein the plurality of light control patterns may include a first light control pattern configured to emit red light based on the blue light, a second light control pattern configured to emit green light based on the blue light, and a third light control pattern configured to emit blue light based on the blue light.

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION

Figure 1:
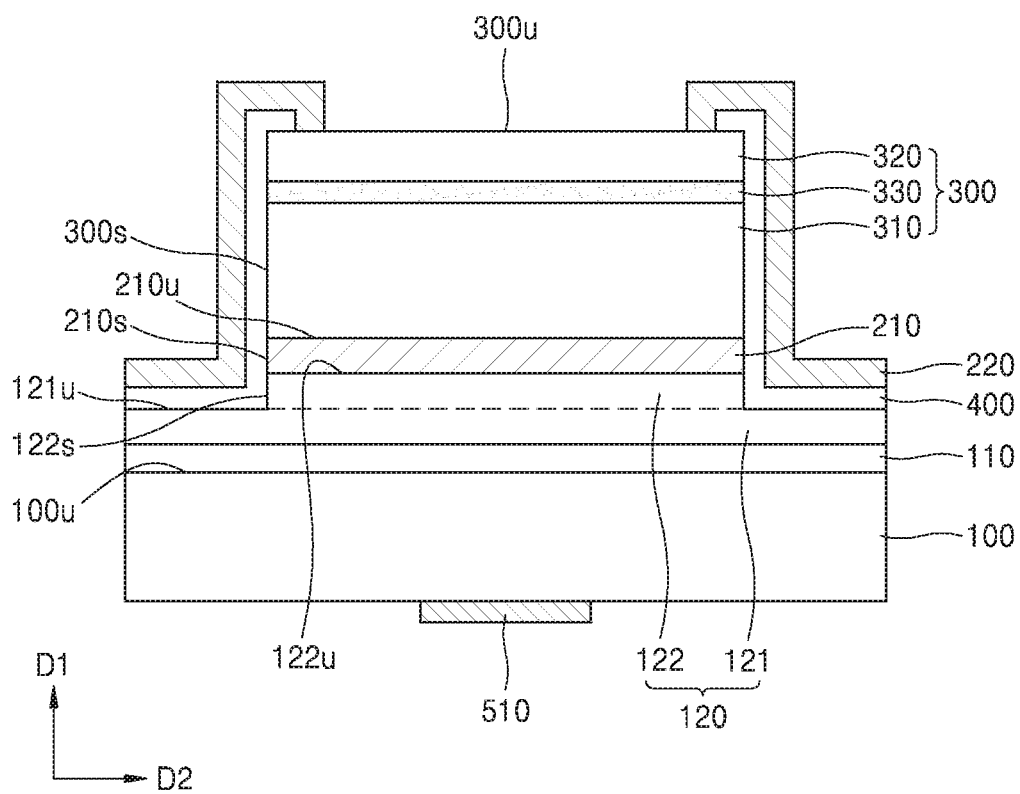
FIG. 1 is a cross-sectional view of a light-emitting device according to an example embodiment.

Reference will now be made in detail to example embodiments of which are illustrated in the accompanying drawings. In the drawings, like reference numerals refer to like elements throughout, and sizes of each of elements are exaggerated for clarity of specification and convenience of explanation. In this regard, the present embodiments may have different forms and should not be construed as being limited to the descriptions set forth herein.

It will be understood that when an element is referred to as being "on" or "above" another element, the element may be in direct contact with the other element or other intervening elements may be present.

The singular forms include the plural forms unless the context clearly indicates otherwise. When a portion "includes" or "comprises" an element, another element may be further included, rather than excluding the existence of the other element, unless otherwise described.

The term "unit" included in the specification may denote a unit that processes at least one of functions or operations, and the unit may be realized as hardware or software or a combination of the hardware or software.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

FIG. 1 is a cross-sectional view of a light-emitting device 11 according to an example embodiment.

Referring to FIG. 1, the light-emitting device 11 including a substrate 100, a buffer layer 110, a seed semiconductor layer 120, a first reflection film 210, a light-emitting pattern 300, passivation films 400, second reflection films 220, and a vertical lower electrode 510 may be provided. The substrate 100 may include a first conductivity type semiconductor substrate. For example, the substrate 100 may include an n-type silicon substrate.

The buffer layer 110 may be arranged on the substrate 100. The buffer layer 110 may mitigate a lattice constant difference between the substrate 100 and the seed semiconductor layer 120. For example, the buffer layer 110 may have a lattice constant between that of the seed semiconductor layer 120 and that of the substrate 100. The buffer layer 110 may include a first conductivity type III-V compound semiconductor. For example, the buffer layer 110 may include n-type gallium nitride (GaN) or n-type aluminum nitride/aluminum gallium nitride (AlN/AlGaN).

The seed semiconductor layer 120 may be arranged on the buffer layer 110 opposite to the substrate 100. The seed semiconductor layer 120 may be a seed layer for growing the first reflection film 210. The seed semiconductor layer 120 may include a lower region 121 and a protrusion region 122. The protrusion region 122 may protrude from an upper surface 121u of the lower region 121 in a first direction D1, which is normal to an upper surface 100u of the substrate 100. The seed semiconductor layer 120 may include a III-V compound semiconductor having a first conductivity type. For example, the seed semiconductor layer 120 may include n-type GaN.

The first reflection film 210 may be arranged on the protrusion region 122 of the seed semiconductor layer 120 opposite to the buffer layer 110. The first reflection film 210 may reflect light. The first reflection film 210 may prevent or reduce light generated from an inside of the light-emitting pattern 300 from being emitted towards a lower side of the light-emitting pattern 300. The first reflection film 210 may extend along an upper surface 122u of the protrusion region 122. Side surfaces 210s of the first reflection film 210 and side surfaces 122s of the protrusion region 122 may be coplanar. The first reflection film 210 may completely cover the upper surface 122u of the protrusion region 122. The first reflection film 210 may include a distributed Bragg reflector (DBR) having conductivity. For example, the first reflection film 210 may include $Al_xGa_{1-x}N/GaN$ (0=x<1) doped with silicon.

The light-emitting pattern 300 may be arranged on the first reflection film 210 opposite to the seed semiconductor layer 120. The light-emitting pattern 300 may generate light by using an electrical signal applied from the outside of the light-emitting pattern 300. Side surfaces 300s of the light-emitting pattern 300 and the side surface 210s of the first reflection film 210 may be coplanar. The light-emitting pattern 300 may include a lower semiconductor layer 310, an active layer 330, and an upper semiconductor layer 320. The lower semiconductor layer 310 may include a first conductivity type III-V compound semiconductor. For example, the lower semiconductor layer 310 may include n-type GaN.

The upper semiconductor layer 320 may be arranged above the lower semiconductor layer 310. The upper semiconductor layer 320 may include a III-V compound semiconductor having a second conductivity type that is different from the first conductivity type. For example, the upper semiconductor layer 320 may include p-type GaN.

The active layer 330 may be arranged between the lower semiconductor layer 310 and the upper semiconductor layer 320. The active layer 330 may generate light by accommodating electrons and holes provided from the lower semiconductor layer 310 and the upper semiconductor layer 320. The active layer 330 may include a single quantum well (SQW) structure, a multi quantum well (MQW) structure, super lattices (SLs), or a combination of these structures. For example, the active layer 330 may include $In_xGa_{1-x}N/GaN$ (0=x<1).

Each of the passivation films 400 may extend along the upper surface 300u and the side surfaces 300s of the light-emitting pattern 300, the side surfaces 210s of the first reflection film 210, the side surfaces 122s of the protrusion region 122, and the upper surface 121u of the lower region 121. The passivation films 400 may protect the light-emitting pattern 300, the first reflection film 210, and the seed semiconductor layer 120 from being damaged, and may prevent or reduce layers from being disconnected from each other. For example, the passivation films 400 may prevent the lower semiconductor layer 310 and the upper semiconductor layer 320 from being short circuited from each other. The passivation films 400 may cover portions of the upper surface 300u of the light-emitting pattern 300. The passivation films 400 may expose the upper surface 300u of the light-emitting pattern 300. In each of the passivation films 400, a portion extending along the upper surface 121u of the lower region 121 may be arranged on a level lower than the upper surface 210u of the first reflection film 210. The passivation films 400 may include an insulating material. For example, the passivation films 400 may include silicon oxide (for example, $SiO_2$), aluminum oxide (for example, $Al_2O_3$), silicon nitride (for example, SiN), aluminum nitride (for example, AlN), or a combination of these materials.

The second reflection films 220 respectively may be arranged on surfaces of the passivation films 400. The second reflection films 220 may reflect light. The second reflection films 220 may prevent or reduce light generated from the inside of the light-emitting pattern 300 from being emitted to the outside of the side surfaces 300s of the light-emitting pattern 300. The second reflection films 220 respectively may extend along the passivation films 400 and may directly contact the upper surface 300u of the light-emitting pattern 300. The second reflection films 220 may expose the upper surface 300u of the light-emitting pattern 300. Light may be emitted through a portion of the upper surface 300u of the light-emitting pattern 300 exposed by the second reflection films 220.

The second reflection films 220 may overlap the first reflection film 210 in a second direction D2, which is parallel to the upper surface 100u of the substrate 100 at a region adjacent to the first reflection film 210. For example, each of the second reflection films 220 may have portions arranged on a level lower than the upper surface 210u of the first reflection film 210. A bottom surface and the side surfaces 300s of the light-emitting pattern 300 may be surrounded by the first reflection film 210 and the second reflection films 220. Accordingly, light generated from the inside of the light-emitting pattern 300 may be directly emitted through the upper surface 300u of the light-emitting pattern 300 or may be emitted through the upper surface 300u of the light-emitting pattern 300 after being reflected by at least one of the first reflection film 210 and the second reflection films 220.

The second reflection films 220 may have conductivity. The second reflection films 220 may be electrically connected to the upper semiconductor layer 320. The second reflection films 220 may include a conductive material corresponding to the conductivity of the upper semiconductor layer 320. For example, the second reflection films 220 may include a p-type electrode material, for example, aluminum (Al) or silver (Ag).

The light-emitting pattern 300 may be surrounded by the first reflection film 210 and the second reflection films 220 except for the upper surface 300u of the light-emitting pattern 300. Lights emitted towards the side surfaces 300s and the lower surface of the light-emitting pattern 300 may be reflected by the first reflection film 210 and the second reflection films 220. Light emitted from the active layer 330 towards the upper surface 300u of the light-emitting pattern 300 and light reflected by the first reflection film 210 and the second reflection film 220 towards the upper surface 300u of the light-emitting pattern 300 may be emitted to the outside of the light-emitting pattern 300 through the upper surface 300u of the light-emitting pattern 300. Accordingly, leakage of light generated from the inside of the light-emitting pattern 300 may be reduced, and thus, the directionality of light may be increased. As a result, the light emission efficiency of the light-emitting device 11 may be increased.

The vertical lower electrode 510 may be arranged on a side of the substrate 100 opposite to the light-emitting pattern 300. The vertical lower electrode 510 may be arranged on a bottom surface of the substrate 100. The vertical lower electrode 510 may correspond to the light-emitting pattern 300. The vertical lower electrode 510 may overlap with the light-emitting pattern 300 in the first direction D1. However, the location of the vertical lower electrode 510 is not limited thereto. According to an example embodiment, the vertical lower electrode 510 may be arranged on a location that does not overlap the light-emitting pattern 300 in the first direction D1. The vertical lower electrode 510 may include a conductive material. The vertical lower electrode 510 may include a conductive material corresponding to the conductivity of the substrate 100. For example, the vertical lower electrode 510 may include an n-type electrode material, for example, titanium/aluminum (Ti/Al) or molybdenum (Mo).

The first reflection film 210 and the second reflection films 220 may reflect light generated from the inside of the light-emitting pattern 300 that travel towards a lower unit and lateral units of the light-emitting pattern 300. Accordingly, the leakage of light may be reduced and uniformity in directionality of light may be increased. As a result, the light directionality and light emission efficiency of the light-emitting device 11 may be increased.

Figure 2:
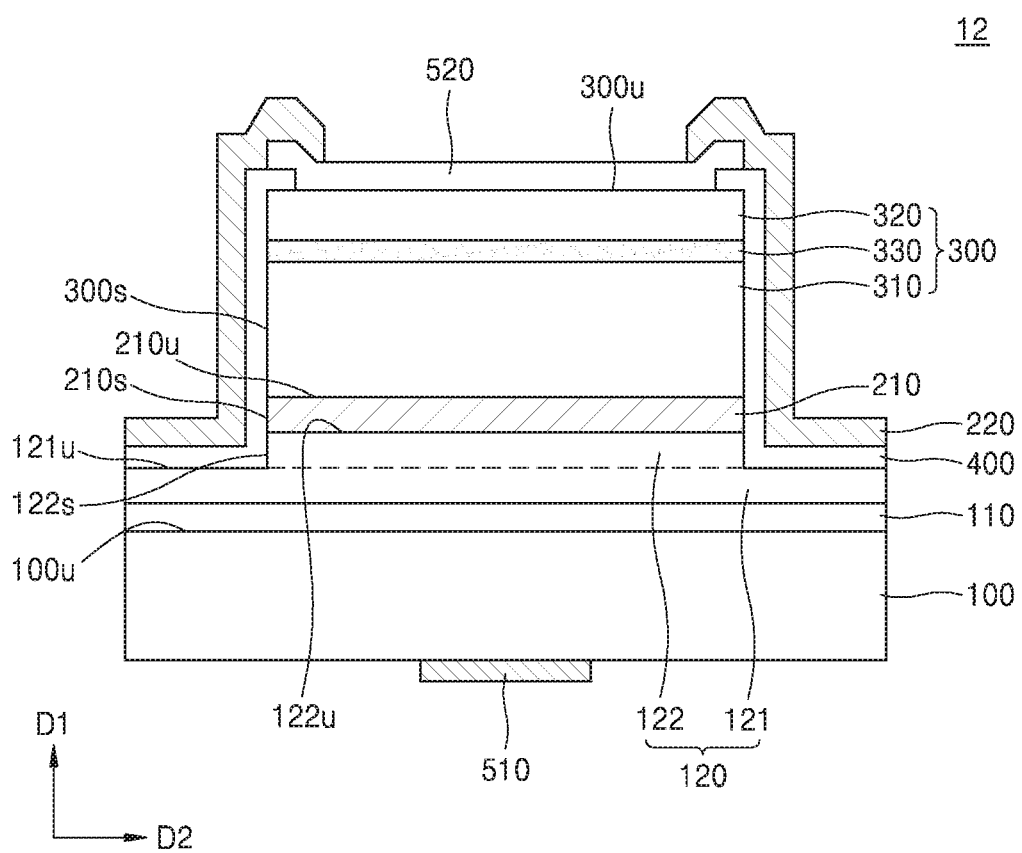
FIG. 2 is a cross-sectional view of a light-emitting device according to an example embodiment.

FIG. 2 is a cross-sectional view of a light-emitting device 12 according to an example embodiment.

Referring to FIG. 2, the light-emitting device 12 may include a transparent electrode 520. The transparent electrode 520 may be arranged on the upper semiconductor layer 320. The transparent electrode 520 may extend along the upper surface 300u of the light-emitting pattern 300. The transparent electrode 520 may separate the second reflection films 220 from the upper semiconductor layer 320 by being arranged between the second reflection films 220 and the upper semiconductor layer 320.

Edge portions of the transparent electrode 520 may be covered by the second reflection films 220. The transparent electrode 520 may be exposed by the second reflection films 220. Light may be emitted through the exposed portion of the transparent electrode 520.

The transparent electrode 520 may directly contact the second reflection films 220 and the upper semiconductor layer 320. Accordingly, the transparent electrode 520 may electrically connect the second reflection films 220 respectively to the upper semiconductor layer 320. For example, the transparent electrode 520 may include indium tin oxide (ITO), indium zinc oxide (IZO), Ag, gold (Au), graphene, nanowires, or a combination of these materials.

Figure 3:
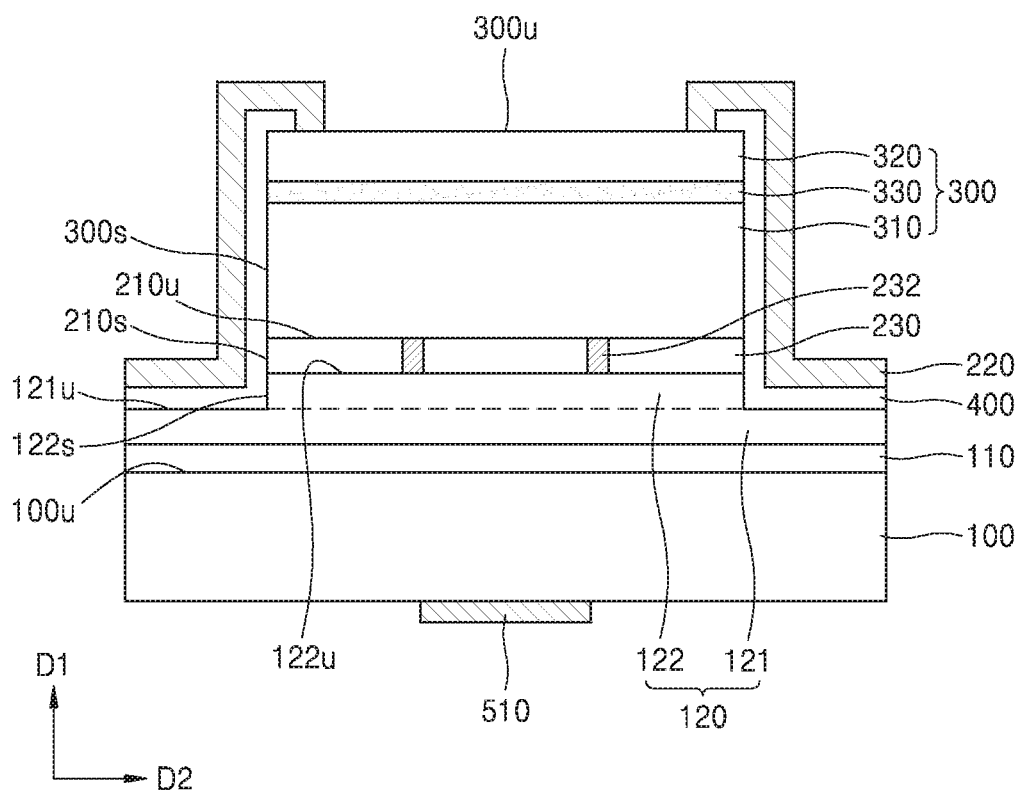
FIG. 3 is a cross-sectional view of a light-emitting device according to an example embodiment.

FIG. 3 is a cross-sectional view of a light-emitting device 13 according to an example embodiment.

Referring to FIG. 3, the light-emitting device 13 may include a third reflection film 230 instead of the first reflection film 210 in FIG. 1 and conductive vias 232. The third reflection film 230 may be arranged between the protrusion region 122 and the lower semiconductor layer 310. The third reflection film 230 may reflect light. The third reflection film 230 may prevent or reduce light generated from the inside of the light-emitting pattern 300 from being emitted to the lower side of the light-emitting pattern 300.

The third reflection film 230 may have a DBR having an insulation property. For example, the third reflection film 230 may include a DBR including zirconium oxide/silicon oxide (for example, $ZrO_2/SiO_2$). The third reflection film 230 may be more stable at a high temperature. For example, the third reflection film 230 may not be degraded at a temperature in a range from about 400° C. to about 500° C.

The conductive vias 232 may be arranged in the third reflection film 230. The conductive vias 232 may extend in the first direction D1 and may pass through the third reflection film 230. The conductive vias 232 may electrically connect the seed semiconductor layer 120 to the lower semiconductor layer 310. The conductive vias 232 may include a conductive material. For example, the conductive vias 232 may include a metal, for example, copper (Cu). In FIG. 3, two conductive vias 232 are depicted as an example, but embodiments are not limited thereto. For example, a single conductive via or more than three conductive vias may be provided.

Figure 4:
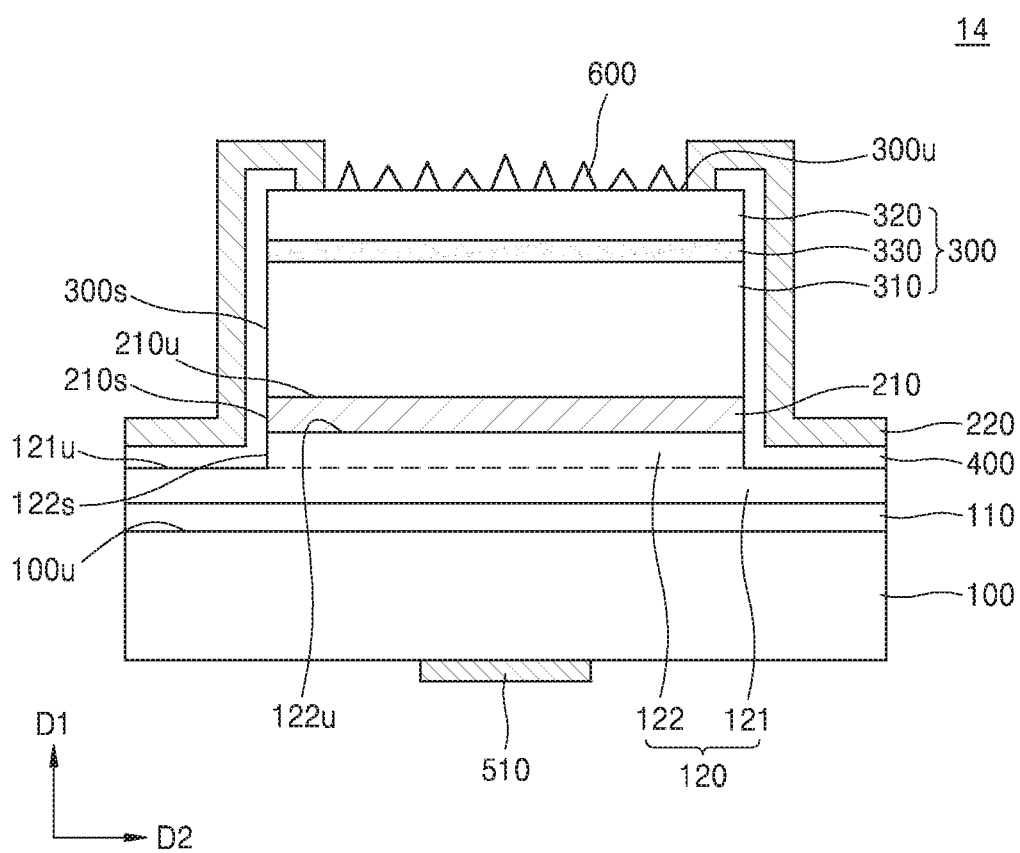
FIG. 4 is a cross-sectional view of a light-emitting device according to an example embodiment.

FIG. 4 is a cross-sectional view of a light-emitting device 14 according to an example embodiment.

Referring to FIG. 4, unlike the light-emitting device 11 described with reference to FIG. 1, the light-emitting device 14 may further include light extraction patterns 600. The light extraction patterns 600 may be arranged on the upper surface 300u of the light-emitting pattern 300. The light extraction patterns 600 may emit light generated from the inside of the light-emitting pattern 300 to the outside of the light-emitting pattern 300. The light extraction patterns 600 may increase light extraction efficiency of the light-emitting device 14. The light extraction patterns 600 may have pitches in a range from about 1 μm to about 5 μm. The light extraction patterns 600 may have a size in a range from about 0.5 μm to about 2 μm.

Figure 5:
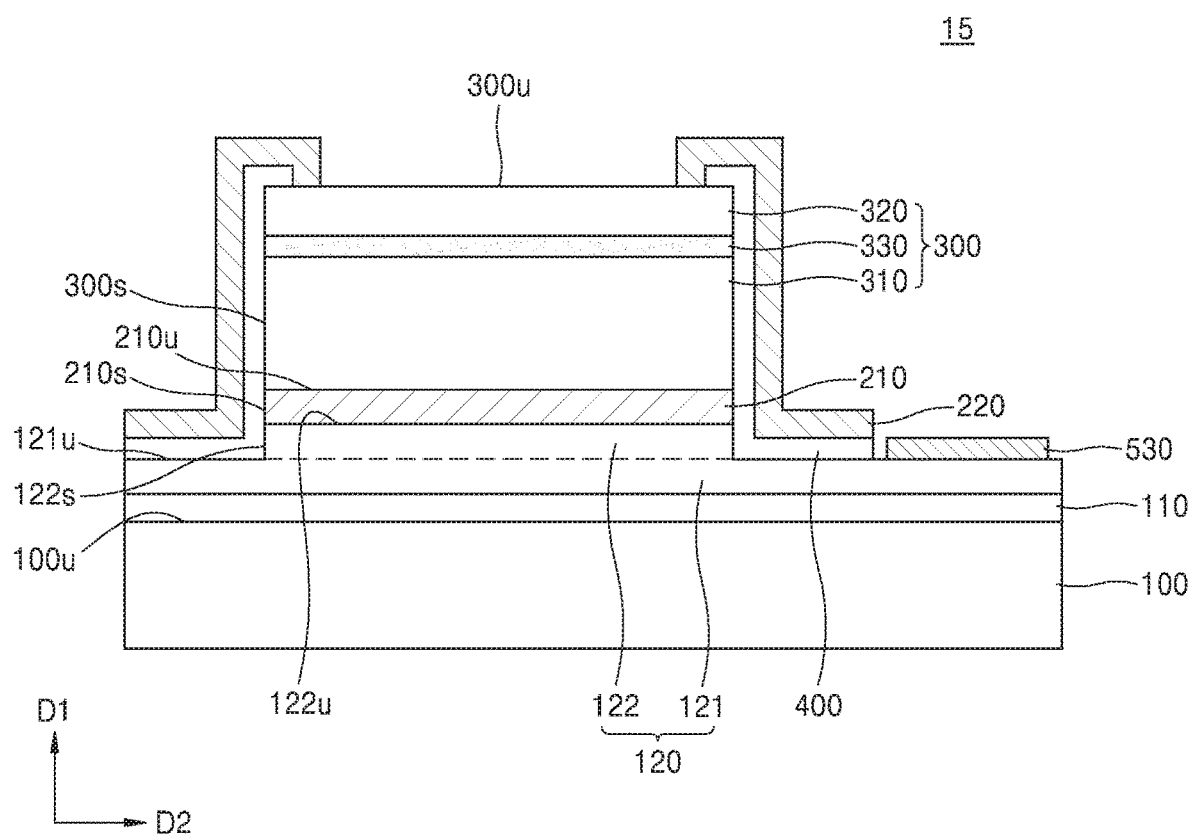
FIG. 5 is a cross-sectional view of a light-emitting device according to an example embodiment.

FIG. 5 is a cross-sectional view of a light-emitting device according to an example embodiment.

Referring to FIG. 5, the light-emitting device 15 may include a horizontal lower electrode 530 instead of the vertical lower electrode 510 as shown in FIG. 1. The horizontal lower electrode 530 may be arranged on the upper surface 121u of the lower region 121. The horizontal lower electrode 530 may be electrically connected to the lower semiconductor layer 310 through the seed semiconductor layer 120 and the first reflection film 210. The horizontal lower electrode 530 may be separated from the second reflection films 220. The horizontal lower electrode 530 may be electrically disconnected from the second reflection films 220. For example, an insulating film may be provided between the horizontal lower electrode 530 and the second reflection films 220. The horizontal lower electrode 530 may include a conductive material corresponding to the conductivity of the seed semiconductor layer 120. For example, the horizontal lower electrode 530 may include Ti/Al or Mo.

The substrate 100 may include an insulating substrate. For example, the substrate 100 may include an intrinsic silicon substrate or a sapphire substrate.

Figure 6:
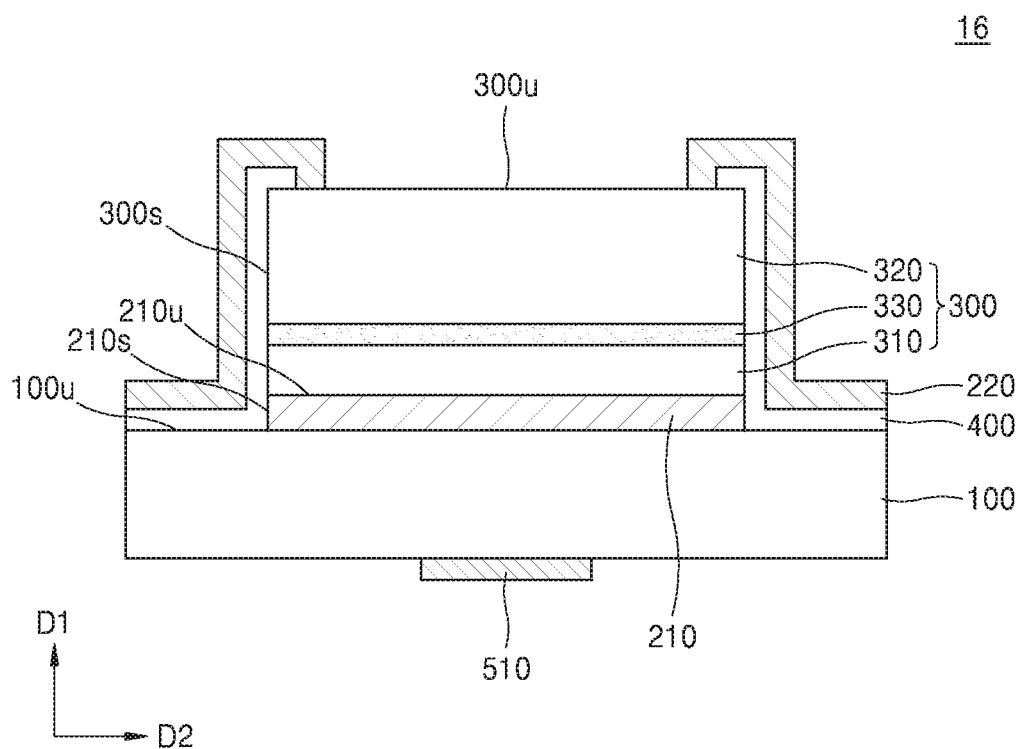
FIG. 6 is a cross-sectional view of a light-emitting device according to an example embodiment.

FIG. 6 is a cross-sectional view of a light-emitting device 16 according to an example embodiment.

Referring to FIG. 6, the first reflection film 210 and the passivation films 400 may be directly arranged on the substrate 100. That is, the light-emitting device 16 may not include the buffer layer 110 and the seed semiconductor layer 120 as shown in FIG. 1. The first reflection film 210 may directly contact the substrate 100. According to an example embodiment, the first reflection film 210 may include a conductive DBR. For example, the first reflection film 210 may include $Al_xGa_{1-x}N/GaN$ (0=x<1) doped with silicon. According to an example embodiment, the first reflection film 210 may include a metal. For example, the first reflection film 210 may include Ag/Au or Al/Au. The first reflection film 210 including Ag/Au or Al/Au may perform as a bonding layer. For example, the first reflection film 210 may be a eutectic bonding layer. The first reflection film 210 may fix the light-emitting pattern 300 on the substrate 100.

The passivation films 400 may directly contact the substrate 100. Bottom surfaces of the passivation films 400 may be coplanar with a bottom surface of the first reflection film 210.

The second reflection films 220 may overlap the first reflection film 210 in a region adjacent to the first reflection film 210 in the second direction D2, which is parallel to the upper surface 100u of the substrate 100. For example, the second reflection films 220 respectively may have portions arranged at a level lower than the upper surface 210u of the first reflection film 210. The bottom surface and the side surfaces 300s of the light-emitting pattern 300 respectively may be surrounded by the first reflection film 210 and the second reflection films 220. Accordingly, light generated from the inside of the light-emitting pattern 300 may be directly emitted through the upper surface 300u of the light-emitting pattern 300 or may be emitted after being reflected by the first reflection film 210 and the second reflection films 220 through the upper surface 300u of the light-emitting pattern 300.

The first conductivity type may be a p-type and the second conductivity type may be an n-type. For example, the lower semiconductor layer 310 may include p-type GaN, and the upper semiconductor layer 320 may include n-type GaN. According to example embodiments, the light-emitting device 16 may further include the transparent electrode 520 described with reference to FIG. 2. According to example embodiments, the light-emitting device 16 may further include the light extraction patterns 600 described with reference to FIG. 4. In some embodiments, the light-emitting device 16 may include the third reflection film 230 and the conductive vias 232 as shown in FIG. 3 instead of the first reflection film 210.

Figure 7:
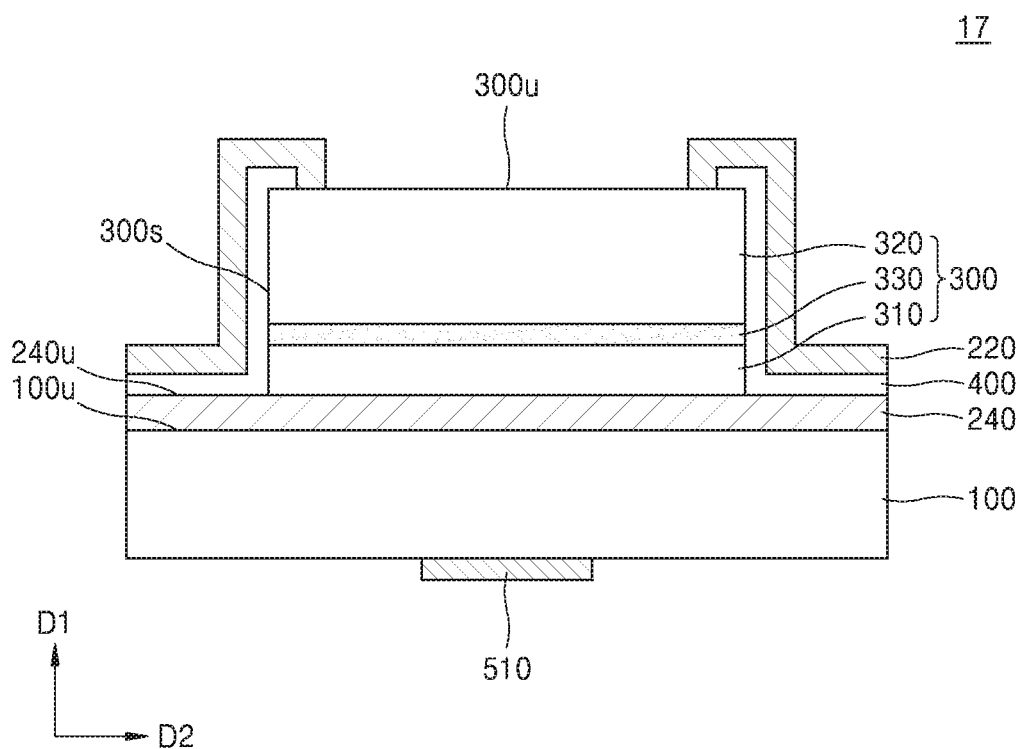
FIG. 7 is a cross-sectional view of a light-emitting device according to an example embodiment.

FIG. 7 is a cross-sectional view of a light-emitting device according to an example embodiment.

Referring to FIG. 7, the light-emitting device 17 may include a fourth reflection film 240 instead of the first reflection film 210 as shown in FIG. 6. The fourth reflection film 240 may be substantially identical to the first reflection film 210 described with reference to FIG. 6 except for the location and shape thereof. The fourth reflection film 240 may extend from a region between the substrate 100 and the lower semiconductor layer 310 towards a region between the substrate 100 and the passivation films 400. For example, the fourth reflection film 240 may be arranged between substrate 100 and the lower semiconductor layer 310 and between the substrate 100 and the passivation films 400. The fourth reflection film 240 may reflect light. The fourth reflection film 240 may prevent or reduce light generated from the inside of the light-emitting pattern 300 from being emitted to a lower side of the light-emitting pattern 300.

The passivation films 400 may be separated from the substrate 100 by the fourth reflection film 240. The passivation films 400 may extend on a region between the second reflection films 220 and the fourth reflection film 240. That is, the passivation films 400 may be arranged between the second reflection films 220 and the fourth reflection film 240.

Figure 8:
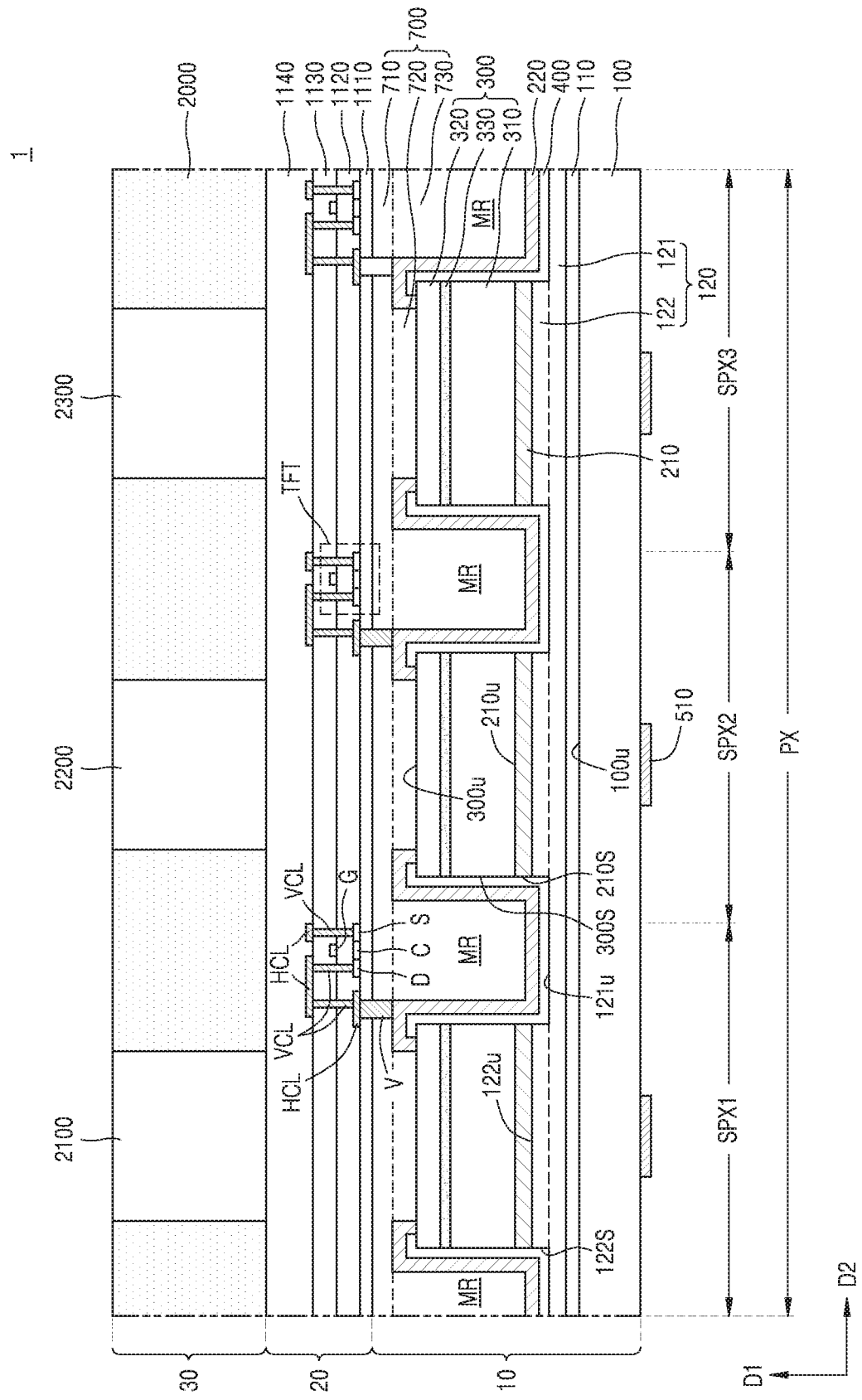
FIG. 8 is a cross-sectional view of a display device according to an example embodiment.

FIG. 8 is a cross-sectional view of a display device according to an example embodiment.

Referring to FIG. 8, a display device 1 including a light-emitting device array layer 10, a thin film transistor (TFT) array layer 20, and a light control layer 30 may be provided. FIG. 8 illustrates one pixel PX, but the display device 1 may include a plurality of pixels. The pixel PX may include a first sub-pixel SPX1, a second sub-pixel SPX2, and a third sub-pixel SPX3 respectively emitting light having different colors. For example, the first sub pixel SPX1, the second sub-pixel SPX2, and the third sub-pixel SPX3 respectively may emit red light, green light, and blue light.

The light-emitting device array layer 10 may include a substrate 100, a lower buffer layer 110, a seed semiconductor layer 120, first reflection films 210, light-emitting patterns 300, passivation films 400, second reflection films 220, a lower capping film 700, and vertical lower electrodes 510. The substrate 100 and the lower buffer layer 110 may be substantially identical to the substrate 100 and the buffer layer 110 described with reference to FIG. 1. The substrate 100 and the lower buffer layer 110 may cross the first sub pixel SPX1, the second sub-pixel SPX2, and the third sub-pixel SPX3.

The seed semiconductor layer 120 may include a lower region 121 and protrusion regions 122 that protrude from an upper surface 121u of the lower region 121 in a first direction D1 normal to an upper surface 100u of the substrate 100. The lower region 121 may extend in a second direction D2, which is parallel to the upper surface 100u of the substrate 100. The protrusion regions 122 may be arranged in the second direction D2 parallel to the upper surface 100u of the substrate 100. The protrusion regions 122 may be arranged in the first sub pixel SPX1, the second sub-pixel SPX2, and the third sub-pixel SPX3. The seed semiconductor layer 120 may include a III-V compound semiconductor having a first conductivity type. For example, the seed semiconductor layer 120 may include n-type GaN.

The first reflection films 210 respectively may be arranged on the protrusion regions 122. The first reflection films 210 may be arranged along the second direction D2. The first reflection films 210 respectively may be arranged in the first sub pixel SPX1, the second sub-pixel SPX2, and the third sub-pixel SPX3. Each of the first reflection films 210 may be substantially identical to the first reflection film 210 described with reference to FIG. 1.

The light-emitting patterns 300 respectively may be arranged on the first reflection films 210. The light-emitting patterns 300 respectively may be arranged in the first sub pixel SPX1, the second sub-pixel SPX2, and the third sub-pixel SPX3. The light-emitting patterns 300 respectively may emit light of the same color. For example, the light-emitting patterns 300 respectively may emit blue color light. The light-emitting patterns 300 may each include a lower semiconductor layer 310, an upper semiconductor layer 320, and an active layer 330. The lower semiconductor layer 310, the upper semiconductor layer 320, and the active layer 330 may be substantially identical to the lower semiconductor layer 310, the upper semiconductor layer 320, and the active layer 330 described with reference to FIG. 1.

Mesa regions MR may be arranged between the light-emitting patterns 300. The mesa regions MR respectively may be concave regions defined by facing side surfaces 300s of the light-emitting patterns 300, facing side surfaces 210s of the first reflection films 210, facing side surfaces 122s of the protrusion regions 122, and the upper surface 121u of the lower region 121. The light-emitting patterns 300 may be separated by the mesa regions MR.

The passivation films 400 may be arranged between the light-emitting patterns 300. The passivation films 400 respectively may be arranged to cross over a pair of sub-pixels, for example, the first sub-pixel SPX1 and the second sub-pixel SPX2 and the second sub-pixel SPX2 and the third sub-pixel SPX3 directly adjacent to each other. Except for the shape, the passivation films 400 may be substantially identical to the passivation films 400 described with reference to FIG. 1. The passivation films 400 respectively may extend from the side surface 300s of one of the light-emitting patterns 300 to the side surface 300s of another light-emitting pattern 300 passing through the upper surface 121u of the lower region 121. For example, the passivation films 400 respectively may extend along a side surface and a bottom surface of the mesa region MR. Both edge portions of each of the passivation films 400 may be arranged on the upper surfaces 300u of the light-emitting patterns 300 directly adjacent to each other.

The second reflection films 220 respectively may be arranged on the passivation films 400. The second reflection films 220 respectively may be arranged cross-over a pair of sub-pixels directly adjacent to each other. Except for the shape, the second reflection films 220 may be substantially and respectively identical to the second reflection films 220 described with reference to FIG. 1. The second reflection films 220 may extend along the passivation films 400. The second reflection films 220 respectively may cover the passivation films 400. Both edge portions of each of the second reflection films 220 may directly contact the upper surfaces 300u of the light-emitting patterns 300 directly adjacent to each other. The second reflection films 220 respectively may be electrically connected to a pair of the upper semiconductor layers 320 directly adjacent to each other.

A lower capping film 700 may be arranged on the light-emitting patterns 300 and the second reflection films 220. The lower capping film 700 may protect the light-emitting patterns 300 and the second reflection films 220. The lower capping film 700 may cross the first sub pixel SPX1, the second sub-pixel SPX2, and the third sub-pixel SPX3. The lower capping film 700 may extend in the second direction D2 on the light-emitting patterns 300. The lower capping film 700 may include an insulating material. For example, the lower capping film 700 may include $SiO_2$, $Al_2O_3$, SiN, AlN, or a combination of these materials.

The lower capping film 700 may include an upper region 710, first protrusion capping regions 720, and second protrusion capping regions 730. The upper region 710 may extend in the second direction D2. The first protrusion capping regions 720 may protrude towards the light-emitting patterns 300 from the upper region 710. The first protrusion capping regions 720 respectively may be arranged in the first sub pixel SPX1, the second sub-pixel SPX2, and the third sub-pixel SPX3. The first protrusion capping regions 720 respectively may be arranged between the second reflection films 220 directly adjacent to each other. The first protrusion capping regions 720 respectively may fill regions defined by opposite surfaces of the second reflection films 220 directly adjacent to each other and the upper surfaces 300u of the light-emitting patterns 300 exposed by the second reflection films 220.

The second protrusion capping regions 730 respectively may extend from the upper region 710 of the lower capping film 700 into the mesa regions MR. The second protrusion capping regions 730 respectively may be arranged crossing a pair of sub-pixels directly adjacent to each other. The second protrusion capping regions 730 respectively may fill the mesa regions MR. The second protrusion capping regions 730 may overlap the light-emitting patterns 300 in the second direction D2. The second protrusion capping regions 730 may directly and respectively contact the second reflection films 220.

The vertical lower electrodes 510 may be arranged on a bottom surface of the substrate 100. The vertical lower electrodes 510 respectively may correspond to the light-emitting patterns 300. The vertical lower electrodes 510 respectively may vertically overlap the light-emitting patterns 300. The vertical lower electrodes 510 respectively may be identical to the vertical lower electrode 510 described with reference to FIG. 1.

The TFT array layer 20 may be arranged on the light-emitting device array layer 10. The TFT array layer 20 may include an upper buffer layer 1110, a lower insulating film 1120, an upper insulating film 1130, an upper capping layer 1140, thin film transistors TFT, vertical conductive lines VCL, and horizontal conductive lines HCL. The upper buffer layer 1110 may be arranged on the lower capping film 700. The upper buffer layer 1110 may extend along an upper surface of the lower capping film 700. The upper buffer layer 1110 may include an insulating material. For example, the upper buffer layer 1110 may include $SiO_2$, $Al_2O_3$, SiN, AlN, or a combination of these materials.

The lower insulating film 1120 may be arranged on the upper buffer layer 1110. The lower insulating film 1120 may extend along an upper surface of the upper buffer layer 1110. The lower insulating film 1120 may have a function of a gate insulating film of each of the thin film transistors TFT. The lower insulating film 1120 may include an insulating material. For example, the lower insulating film 1120 may include $SiO_2$, $Al_2O3$, SiN, AlN, or a combination of these materials.

The upper insulating film 1130 may be arranged on the lower insulating film 1120. The upper insulating film 1130 may extend along an upper surface of the lower insulating film 1120. The upper insulating film 1130 may perform an interlayer insulating layer for protecting gates G of the thin film transistors TFT and for arranging the vertical conductive lines VCL and horizontal conductive lines HCL. The upper insulating film 1130 may include an insulating material. For example, the upper insulating film 1130 may include $SiO_2$, $Al_2O_3$, SiN, AlN, or a combination of these materials.

The upper capping layer 1140 may be arranged on the upper insulating film 1130. The upper capping layer 1140 may extend along an upper surface of the upper insulating film 1130. The upper capping layer 1140 may protect the thin film transistors TFT and the vertical conductive line VCL and the horizontal conductive line HCL. The upper capping layer 1140 may include an insulating material. For example, the upper capping layer 1140 may include $SiO_2$, $Al_2O_3$, SiN, AlN, or a combination of these materials.

The thin film transistors TFT respectively may be arranged to correspond to the second reflection films 220 in the second direction D2. Vias V respectively may be arranged between the thin film transistors TFT and the second reflection films 220 respectively corresponding to the thin film transistors TFT. The vias V may include a conductive material, for example, a metal. The thin film transistors TFT respectively may be electrically connected to the second reflection films 220 via the vias V.

The thin film transistors TFT respectively may include a source region S, a drain region D, a channel region C, a gate electrode G, and the lower insulating film 1120. The drain region D may be electrically connected to a controller provided outside of the display device 1 through the corresponding vertical conductive line VCL, and the horizontal conductive line HCL.

The source region D may be electrically connected to the second reflection films 220 through the corresponding vertical conductive line VCL, the horizontal conductive line HCL, and the via V.

The channel region C may be arranged between the source region S and the drain region D. The source region S, the channel region C, and the drain region D may be formed by a process of crystallizing both edge portions of an amorphous silicon pattern extending in the second direction D2 by irradiating a laser. The source region S and the drain region D may be crystallized regions and the channel region C may be an amorphous region.

The gate electrode G may be arranged on an opposite side of the channel region C with the lower insulating film 1120 therebetween. The gate electrode G may include a conductive material, for example, a metal.

The light control layer 30 may be arranged on the TFT array layer 20. The light control layer 30 may include black matrixes 2000 and a first light control pattern 2100, a second light control pattern 2200, and a third light control pattern 2300 respectively arranged between the black matrixes 2000. The first light control pattern 2100, the second light control pattern 2200, and the third light control pattern 2300 respectively may be arranged in the first sub pixel SPX1, the second sub-pixel SPX2, and the third sub-pixel SPX3. The first light control pattern 2100, the second light control pattern 2200, and the third light control pattern 2300 respectively may correspond to the light-emitting patterns 300.

The first light control pattern 2100 may emit red light based on light emitted from the light-emitting pattern 300 in the first sub-pixel SPX1. When the light-emitting pattern 300 emits blue light, the first light control pattern 2100 may include quantum dots (QDs) or phosphors that emit red light by being excited by the blue light. The QDs may have a core-shell structure including a core unit and a shell unit, and also, may have a particle structure without a shell. The core-shell structure may include a single shell or a multi-shell. For example, the multi-shell may be a double shell. According to example embodiments, the QDs may include at least one of II-VI compound semiconductor, a III-V compound semiconductor, a IV-IV compound semiconductor, a Group IV based semiconductor, and graphene QDs. For example, the QDs may include at least one of cadmium (Cd), selenium (Se), zinc (Zn), sulfur (S), and indium phosphide (InP), but example embodiments are not limited thereto. The QDs may have a diameter of a few tens of nm or less. For example, the QDs may have a diameter of 10 nm or less. The first light control pattern 2100 may further include a photoresist and a light scattering agent.

The second light control pattern 2200 may emit green light based on light emitted from the light-emitting pattern 300 in the second sub-pixel SPX2. When the light-emitting pattern 300 emits blue light, the second light control pattern 2200 may include QDs or phosphors that emit green light by being excited by the blue light. The second light control pattern 2200 may further include a photoresist and a light scattering agent.

The third light control pattern 2300 may emit the same color light as light emitted from the light-emitting pattern 300 in the third sub-pixel SPX3. When blue light is emitted from the light-emitting pattern 300, the third light control pattern 2300 may emit blue light based on light emitted from the light-emitting pattern 300. The third light control pattern 2300 may include a photoresist and a light scattering agent.

The black matrixes 2000 respectively may be arranged to cross over a pair of sub-pixels, for example, the first sub-pixels SPX1 and the second sub-pixel SPX2, and the second sub-pixel SPX2 and the third sub-pixel SPX3 directly adjacent to each other. The black matrixes 2000 may absorb light to prevent crosstalk between the first sub pixel SPX1, the second sub-pixel SPX2, and the third sub-pixel SPX3.

Leakage of light generated in the light-emitting patterns 300 by the first reflection film 210 and the second reflection film 220 is reduced or prevented, and thus, crosstalk between the first sub pixel SPX1, the second sub-pixel SPX2, and the third sub-pixel SPX3 is reduced or prevented. Furthermore, since lights generated in the light-emitting patterns 300 are emitted through only upper surfaces 300*u* of the light-emitting patterns 300, light directionality of light of the light-emitting patterns 300 is increased. As a result, the light directionality and the light-emitting efficiency of the display device 1 may be increased. Furthermore, color mixing of the display device 1 is reduced, and thus, a contrast characteristic may be increased.

Figure 9:
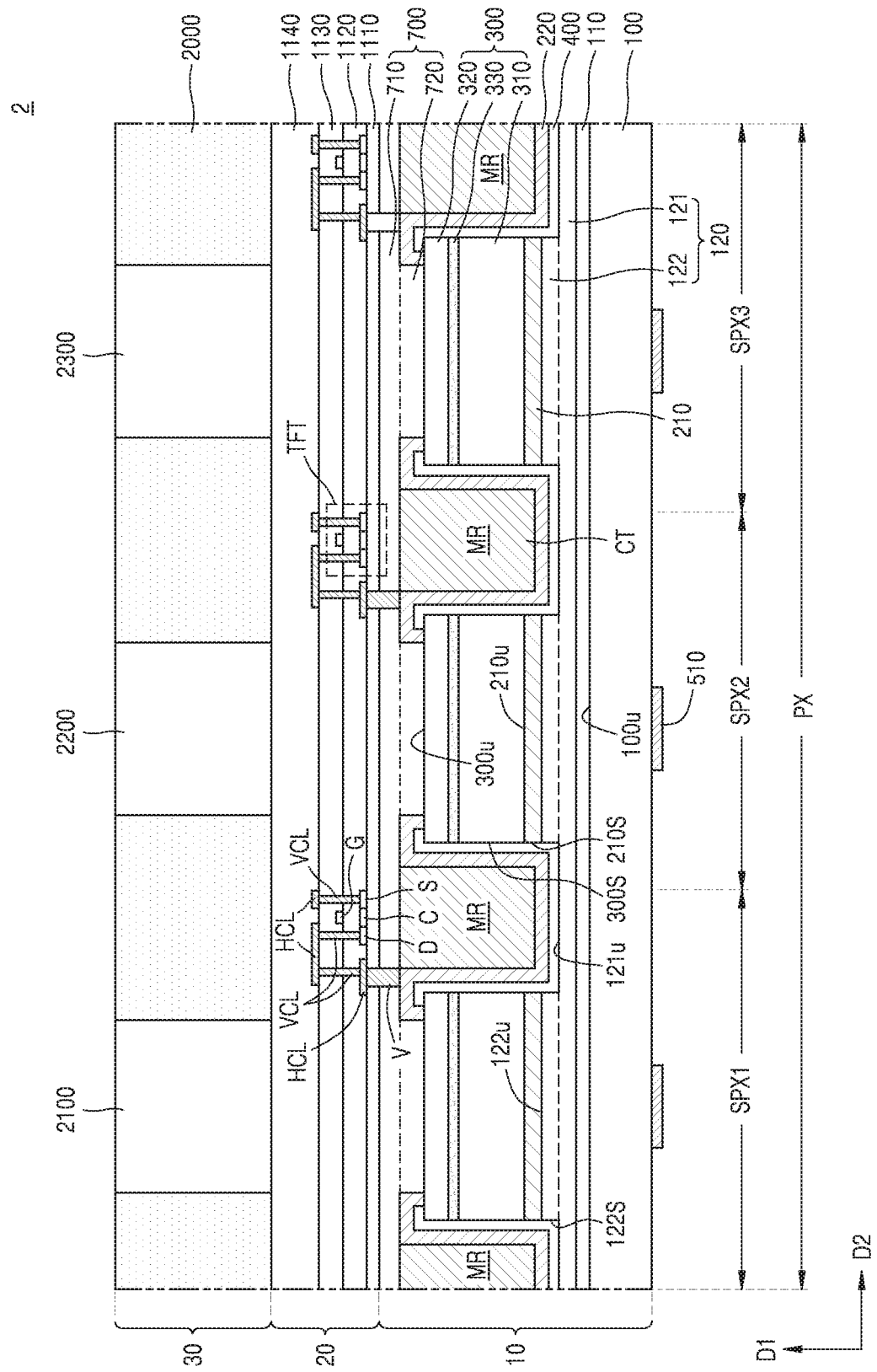
FIG. 9 is a cross-sectional view of a display device according to an example embodiment.

FIG. 9 is a cross-sectional view of a display device 2 according to an example embodiment.

Referring to FIG. 9, the display device 2 may include contacts CT instead of the second protrusion capping regions 730 as shown in FIG. 8. The contacts CT respectively may be arranged between the light-emitting patterns 300 directly adjacent to each other. The contacts CT respectively may be arranged between the second reflection films 220 and the upper region 710 of the lower capping film 700. The contacts CT respectively may fill the mesa region MR and may contact the second reflection films 220. The contacts CT may have conductivity. For example, the contacts CT may include a metal, for example, Cu. Accordingly, the contacts CT may be electrically connected to the second reflection films 220.

Figure 10:
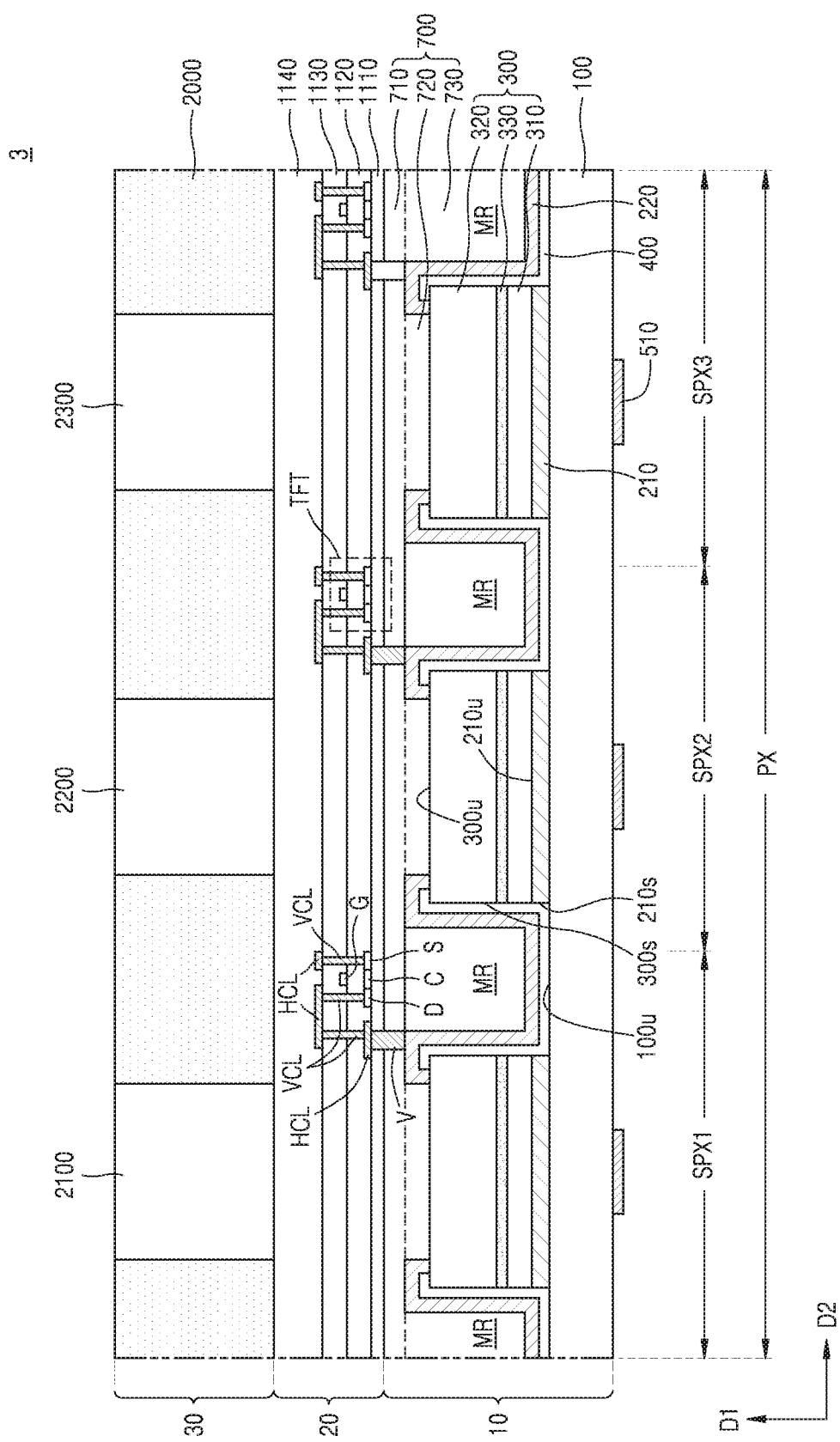
FIG. 10 is a cross-sectional view of a display device according to an example embodiment.

FIG. 10 is a cross-sectional view of a display device 3 according to another embodiment.

Referring to FIG. 10, the first reflection films 210 and the passivation films 400 may be arranged directly on the substrate 100. That is, the display device 3 may not include the lower buffer layer 110 and the seed semiconductor layer 120 as shown in FIG. 8.

Bottom surfaces of the first reflection films 210 and bottom surfaces of the passivation films 400 may directly contact the upper surface 100*u* of the substrate 100. At a region adjacent to the upper surface 100*u* of the substrate 100, the bottom surfaces of the first reflection films 210 and the bottom surfaces of the passivation films 400 may be coplanar. For example, the first reflection films 210 respectively may include DBR having conductivity or a metal.

The light-emitting patterns 300 may be substantially and respectively identical to the light-emitting patterns 300 described with reference to FIG. 6. For example, the lower semiconductor layer 310 may include p-type GaN, and the upper semiconductor layer 320 may include n-type GaN.

In regions adjacent to the first reflection films 210, the second reflection films 220 may overlap the first reflection films 210 in the second direction D2, which is parallel to the upper surface 100*u* of the substrate 100. Bottom surfaces and side surfaces 300*s* of the light-emitting patterns 300 respectively may be surrounded by the first reflection films 210 and the second reflection films 220. Accordingly, light generated from the inside of the light-emitting pattern 300 may be directly emitted through the upper surface 300*u* of the light-emitting pattern 300 or may be emitted through the upper surface 300*u* of the light-emitting pattern 300 after being reflected by the first reflection film 210 and the second reflection films 220.

Figure 11:
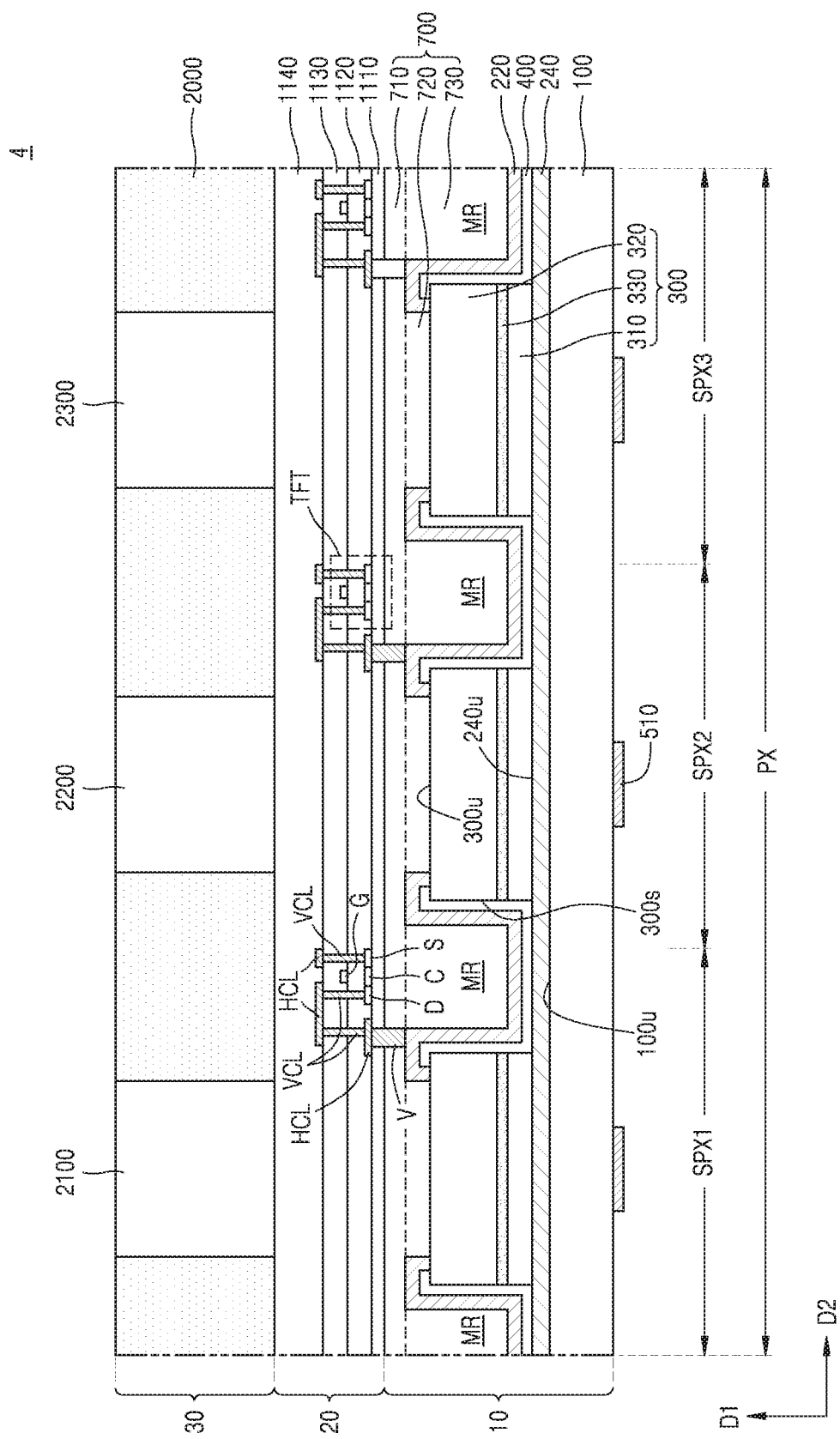
FIG. 11 is a cross-sectional view of a display device according to an example embodiment.

FIG. 11 is a cross-sectional view of a display device according to another embodiment.

Referring to FIG. 11, the display device 4 may include a fourth reflection film 240 instead of the first reflection films 210. The fourth reflection film 240 may be substantially identical to the fourth reflection film 240 described with reference to FIG. 7 except for the location and shape thereof.

The fourth reflection film 240 may extend along the upper surface 100u of the substrate 100. The fourth reflection film 240 may be arranged crossing over the first sub pixel SPX1, the second sub-pixel SPX2, and the third sub-pixel SPX3. The fourth reflection film 240 may be arranged between the lower semiconductor layers 310 and between the substrate 100 and the passivation films 400. The fourth reflection film 240 may reflect light. The fourth reflection film 240 may prevent or reduce light generated in the light-emitting patterns 300 from being emitted towards lower sides of the light-emitting patterns 300.

The passivation films 400 may be separated from the substrate 100 by the fourth reflection film 240. The passivation films 400 respectively may extend along a region between each of the second reflection films 220 and the fourth reflection film 240. The passivation films 400 may be arranged between the second reflection films 220 and the fourth reflection film 240.

According to example embodiments, the light directionality and light-emitting efficiency of a light-emitting device may be increased.

Also, according to the example embodiments, the light directionality and light-emitting efficiency of a display device may be increased.

Also, according to the example embodiments, crosstalk phenomenon may be reduced.

While example embodiments have been described with reference to the figures, it will be understood by those of ordinary skill in the art that various changes in form and details may be made therein without departing from the spirit and scope as defined by the following claims.

What is claimed is:

1. A light-emitting device comprising:
 a substrate;
 a light-emitting pattern provided on the substrate;
 a first reflection film provided between the light-emitting pattern and the substrate;
 a second reflection film provided on a side surface of the light-emitting pattern;
 a passivation film provided between the light-emitting pattern and the second reflection film; and
 a vertical lower electrode provided on a bottom surface of the substrate,
 wherein the second reflection film is electrically connected to the light-emitting pattern, and a portion of light generated from the light-emitting pattern is emitted through an upper surface of the light-emitting pattern after being reflected by at least one of the first reflection film and the second reflection film,
 wherein the side surface of the light-emitting pattern is surrounded by the second reflection film,
 wherein a side surface of the first reflection film and the side surface of the light-emitting pattern are coplanar,
 wherein the light-emitting pattern comprises a lower semiconductor layer, an active layer, and an upper semiconductor layer that are sequentially stacked on the first reflection film,
 wherein the substrate and the lower semiconductor layer are respectively a first conductivity type,
 wherein the upper semiconductor layer is a second conductivity type that is different from the first conductivity type,
 wherein the vertical lower electrode is electrically connected to the lower semiconductor layer through the substrate and the first reflection film, and
 wherein the passivation film directly contacts an upper surface of the upper semiconductor layer.

2. The light-emitting device of claim 1, wherein the second reflection film is provided along the passivation film and contacts the upper surface of the light-emitting pattern.

3. The light-emitting device of claim 1, wherein the second reflection film overlaps the first reflection film in a direction parallel to the upper surface of the substrate in a region adjacent to the first reflection film.

4. The light-emitting device of claim 1, further comprising a transparent electrode provided on the upper surface of the light-emitting pattern, wherein the second reflection film is electrically connected to the light-emitting pattern through the transparent electrode.

5. The light-emitting device of claim 1, wherein the first reflection film is provided along the upper surface of the substrate and protrudes in a direction parallel to the upper surface of the substrate from the side surface of the light-emitting pattern.

6. The light-emitting device of claim 1, wherein the first reflection film comprises a distributed Bragg reflector (DBR) having conductivity.

7. The light-emitting device of claim 1, wherein the first reflection film comprises a distributed Bragg reflector (DBR) having an insulating property, and wherein the light-emitting device further comprises a conductive via that passes through the first reflection film in a direction normal to the upper surface of the substrate.

8. The light-emitting device of claim 1, wherein the first reflection film comprises a metal.

9. The light-emitting device of claim 1, further comprising light extraction patterns provided on the upper surface of the light-emitting pattern.

10. A light-emitting device comprising:
 a substrate;
 a light-emitting pattern provided on the substrate;
 a first reflection film provided between the light-emitting pattern and the substrate;
 a second reflection film provided on a side surface of the light-emitting pattern;
 a passivation film provided between the light-emitting pattern and the second reflection film; and
 a seed semiconductor layer provided between the first reflection film and the substrate, the seed semiconductor layer comprising a lower region and a protrusion region protruding from an upper surface of the lower region in a direction normal to an upper surface of the substrate,
 wherein the second reflection film is electrically connected to the light-emitting pattern, and a portion of light generated from the light-emitting pattern is emitted through an upper surface of the light-emitting pattern after being reflected by at least one of the first reflection film and the second reflection film,
 wherein the side surface of the light-emitting pattern is surrounded by the second reflection film,
 wherein a side surface of the first reflection film and the side surface of the light-emitting pattern are coplanar,
 wherein the first reflection film is provided between the light-emitting pattern and the protrusion region, and
 wherein a side surface of the protrusion region is coplanar with the side surface of the first reflection film and the side surface of the light-emitting pattern.

11. The light-emitting device of claim 10, further comprising a horizontal lower electrode provided on the upper surface of the lower region,
- wherein the light-emitting pattern comprises a lower semiconductor layer, an active layer, and an upper semiconductor layer that are sequentially stacked on the first reflection film,
- wherein the lower semiconductor layer and the seed semiconductor layer are respectively a first conductivity type,
- wherein the upper semiconductor layer is a second conductivity type,
- wherein the horizontal lower electrode and the lower semiconductor layer are electrically connected to each other through the seed semiconductor layer and the first reflection film, and
- wherein the passivation film directly contacts an upper surface of the upper semiconductor layer.

12. A display device comprising:
- a substrate;
- a plurality of light-emitting patterns provided on the substrate;
- a plurality of first reflection films respectively provided between the plurality of light-emitting patterns and the substrate;
- a plurality of passivation films respectively provided between the plurality of light-emitting patterns;
- a plurality of second reflection films respectively provided along the plurality of passivation films; and
- a plurality of transistors respectively electrically connected to the plurality of light-emitting patterns;
- wherein a portion of beams generated from the plurality of light-emitting patterns, respectively, are reflected by at least one of the plurality of first reflection films and the plurality of second reflection films, and are emitted through the plurality of light-emitting patterns,
- wherein side surfaces of the plurality of light-emitting patterns are surrounded by the plurality of second reflection films, and
- wherein a side surface of each of the plurality of first reflection films and a side surface of each of the plurality of light-emitting patterns are coplanar.

13. The display device of claim 12, further comprising a lower capping film provided on the plurality of light-emitting patterns and the plurality of second reflection films,
- wherein mesa regions are provided between the plurality of light-emitting patterns, and
- wherein the lower capping film comprises:
  - an upper region;
  - first protrusion capping regions protruding respectively from the upper region towards each of the plurality of light-emitting patterns; and
  - second protrusion capping regions respectively protruding from the upper region into the mesa regions.

14. The display device of claim 12, wherein the plurality of passivation films respectively extend from the side surfaces of the plurality of light-emitting patterns directly adjacent to the plurality of passivation films to upper surfaces of the plurality of light-emitting patterns and contact the upper surfaces of the plurality of light-emitting patterns.

15. The display device of claim 12, further comprising:
- a lower capping film provided on the plurality of light-emitting patterns and the plurality of second reflection films; and
- a plurality of contacts respectively provided between the plurality of light-emitting patterns,
- wherein the lower capping film comprises:
  - an upper region; and
  - protrusion capping regions respectively protruding from the upper region towards each of the plurality of light-emitting patterns, and
- wherein the plurality of contacts respectively are provided between the upper region and the plurality of second reflection films.

16. The display device of claim 12, further comprising a plurality of light control patterns respectively provided on the plurality of light-emitting patterns,
- wherein the plurality of light control patterns respectively control characteristics of light emitted from the plurality of light-emitting patterns.

17. The display device of claim 16, wherein the plurality of light-emitting patterns respectively emit blue light, and
- wherein the plurality of light control patterns comprise:
  - a first light control pattern configured to emit red light based on the blue light;
  - a second light control pattern configured to emit green light based on the blue light; and
  - a third light control pattern configured to emit blue light based on the blue light.

* * * * *